United States Patent
Reisinger

(10) Patent No.: US 12,401,153 B2
(45) Date of Patent: Aug. 26, 2025

(54) RF-CONNECTOR SYSTEM

(71) Applicant: Rohde & Schwarz GmbH & Co. KG, Munich (DE)

(72) Inventor: Hans-Georg Reisinger, Illertissen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 603 days.

(21) Appl. No.: 17/744,315

(22) Filed: May 13, 2022

(65) Prior Publication Data

US 2023/0369801 A1 Nov. 16, 2023

(51) Int. Cl.
| | |
|---|---|
| H01R 13/516 | (2006.01) |
| H01R 24/50 | (2011.01) |
| H01R 24/54 | (2011.01) |
| H01R 25/00 | (2006.01) |
| H05K 5/00 | (2006.01) |

(52) U.S. Cl.
CPC .......... *H01R 13/516* (2013.01); *H01R 24/50* (2013.01); *H01R 24/542* (2013.01); *H01R 25/006* (2013.01); *H05K 5/0069* (2013.01)

(58) Field of Classification Search
CPC .... H01R 13/516; H01R 24/50; H01R 24/542; H01R 25/006; H05K 5/0069; H01P 3/02
USPC .......................................................... 439/63
See application file for complete search history.

(56) References Cited

U.S. PATENT DOCUMENTS

| | | | |
|---|---|---|---|
| 4,995,815 A * | 2/1991 | Buchanan | H01R 9/0515 333/260 |
| 6,379,183 B1 | 4/2002 | Ayres | |
| 10,541,494 B2 | 1/2020 | Tran et al. | |
| 11,637,387 B2 * | 4/2023 | Wu | H01R 13/639 439/63 |
| 2009/0197433 A1 * | 8/2009 | Hermant | H01R 12/725 439/63 |
| 2009/0211806 A1 | 8/2009 | Taylor | |
| 2015/0137912 A1 | 5/2015 | Nagel et al. | |

FOREIGN PATENT DOCUMENTS

| | | | |
|---|---|---|---|
| DE | 2104188 A * | 8/1972 | ............. C21D 1/767 |
| DE | 10 2005 062 436 A1 | 7/2007 | |
| EP | 2 104 188 A1 | 9/2009 | |

OTHER PUBLICATIONS

Elektroniknet, "Digi-Key nennt Kriterien für die Auswahl, Welcher HF-Steckverbinder ist der richtige?" retrieved from https://www.elektroniknet.de/e-mechanik-passive/verbindungstechnik/welcher-hfsteckverbinder-ist-der-richtige.188830/seite-2.html on May 13, 2022, 2 pages.
"Analysis-Definition_RF-Port_DRAFT_v1 Folien 24-27", 4 pages.

* cited by examiner

Primary Examiner — Tulsidas C Patel
Assistant Examiner — Jeffrey Mountain
(74) Attorney, Agent, or Firm — DITTHAVONG, STEINER & MLOTKOWSKI

(57) ABSTRACT

RF-connector systems for coupling an RF-cable to a printed circuit board are disclosed herein. According to one aspect, an RF-connector system (1) comprises: a printed circuit board (2), an RF-connector (3) attached to the printed circuit board (2), a clamping sleeve (20) designed to clamp an adapter (4) attached to the RF connector (3), and a joint bearing (30) attachable to a housing (6) of a measuring device. The joint bearing (30) comprises a support (5). The support (5) is designed to receive the clamping sleeve (20) inside of the support (5). And the joint bearing (30) is designed to clamp the clamping sleeve (20) inside of the support (5).

20 Claims, 7 Drawing Sheets

RF-CONNECTOR SYSTEM

TECHNICAL FIELD

The present disclosure relates to an RF-connector system, especially to an RF-connector system for a measuring device.

BACKGROUND

In radio frequency (RF) applications, different (RF-) connectors are used. Frequently used connectors are, for example, SMA connectors, which are used for a frequency range from 1 GHz to 26.5 GHz.

SUMMARY

This disclosure aims to ensure a reliable connection by an RF-connector. For ensuring the reliable connection by the RF-connector, this disclosure aims to avoid mechanical stress on the RF-connector and its connection interfaces.

According to a first aspect of the present disclosure, an RF-connector system is provided. The RF-connector system comprises: a printed circuit board, an RF-connector attached to the printed circuit board, and an adapter attached to the RF-connector, wherein the adapter comprises a radially outwardly extending ring. The RF-connector system further comprises a support attachable to a housing of a measuring device. The support is designed to receive the ring of the adapter inside of the support. Further, the support is designed to clamp the ring.

By clamping the ring of the adapter by the support, a mechanical stress at the connection interface between the printed circuit board and the RF-connector may be eliminated or at least significantly reduced. This may be, because a force or torque acting on the adapter (for example, due to a cable connected or attached to the adapter) may not transferred to the connection interface between the printed circuit board and the RF-connector, but may instead be absorbed by the support and then transferred away from the connection interface, such as to the housing of the measuring device.

For example, the support may absorb mechanical stress in, and/or by a twisting (e.g., torsion) about, different directions (such as at least one of an axial direction, and a radial direction, and the horizontal (x), and the vertical (y), and a direction (z) perpendicular to a plane spanned by x and y). Alternatively or additionally, the support may compensate dimensional deviations (of the RF-connector, etc.) in the horizontal and vertical direction. And due to the eliminated, or at least significantly reduced, mechanical stress on the connector and its connection to the printed circuit board, an incorrect or distorted transmission of RF signals can be avoided.

For example, it may be avoided that a mechanical stress due to frequent attaching and detaching of an RF-cable to or from the connector, the weight force of the cable connected to the connector, tolerances of the connector relative to other parts (such as the housing of the measuring device or the printed circuit board), a leverage extending from the connection point where the connector is attached to a connection point where the HF-cable is attached, and/or due to mobile applications, acts on the connection interface between the printed circuit board and the connector.

The adapter may be provided to conserve a contacting surface of the RF-connector, such as a contacting surface of a conductor arranged inside of the RF-connector. For example, by the adapter, a frequent attaching and detaching of an RF-cable may not wear the contacting surface of the RF-connector. Further, a turning of the RF-cable about its longitudinal axis may not wear the contacting surface of the RF-connector. In other words, the adapter may prevent the RF-connector from wear, and may thus represent a so-called conservation adapter or sacrificial adapter or wear adapter.

The adapter may have a certain length that effects a corresponding lever extending outwardly from the RF-connector. However, by the support clamping the ring of the adapter and thereby supporting the ring, the lever provided by the adapter does not result in an undesired mechanical stress at the connection interface between the printed circuit board and the RF-connector.

According to a first implementation form of said first aspect, the RF-connector system further comprises a screw (bolt) arranged such that clamping of the ring by the support can be effected by the screw cooperating with the support. Accordingly, by turning the screw the support can selectively clamp the ring or permit the ring, and thus the adapter, to be removed from the support. For example, the screw is arranged such that screwing the screw into the support effects that a space, in which the ring of the adapter is arranged, is reduced, thereby clamping the ring inside of the support.

According to a further implementation form of said first aspect, the support comprises a slit that extends axially. The slit imparts an elasticity to the support, which elasticity can be used for clamping by the support, e.g. for moving the support between an open position that permits the ring to be received in (or removed from) the support and a closed position that clamps the ring inside of the support. For example, the elasticity can effect a force that biases the support into the open position, whereby a clamping and unclamping of the ring by the support can be simplified. Further, the slit facilitates the clamping by the support, because for example a fastener (such as a screw) cooperating with the support in order to clamp can be tightened with less torque.

According to a further implementation form of said first aspect, the RF-connector system further comprises an additional ring arranged to increase the friction between the support and the ring of the adapter. The additional ring may comprise a surface that is roughened to comprise a surface roughness (Ra) greater than a surface roughness (Ra) of the ring of the adapter. The roughened surface of the additional may be a radially inwardly facing surface and/or a radially outwardly facing surface.

According to a further implementation form of said first aspect, the ring comprises an outer (contact) surface that defines the outer circumference of the ring, wherein the outer surface is roughened to increase a coefficient of friction such that a frictional force is increased when the ring is clamped by the support. The outer surface may be roughened to comprise a surface roughness (Ra) greater than a surface roughness (Ra) of a surface of the ring facing in an axial direction.

According to a further implementation form of said first aspect, the support comprises a contact surface that faces in a radial inward direction, wherein the contact surface is roughened to increase a coefficient of friction such that a frictional force is increased when the ring is clamped by the support. The contact surface may be roughened to comprise a surface roughness (Ra) greater than a surface roughness (Ra) of a surface of the support facing in an axial direction and/or oriented outwardly, such as away from the printed circuit board.

According to a further implementation form of said first aspect, the RF-connector system further comprises an insulating layer arranged to electrically and thermally decouple the support from the housing of the measuring device. For example, when the support is attached to the housing of the measuring device, the insulating layer may be sandwiched between the housing and the support.

According to a further implementation form of said first aspect, the ring comprises an outer surface that defines the outer circumference of the ring, wherein the outer surface is (in a lateral cross-sectional view, e.g., a cross section parallel to the axis defined by the ring) curved so as to allow the ring to be tilted relative to the support. For example, the curved contact surface effects that the ring and thus the adapter received inside of the support not only can rotate about its axis (roll axis) but also can be tilted relative to the support about one or more different axes, such as a pitch axis and/or a yaw axis. Thereby, the ring and thus the adapter can be clamped in different orientations relative to the support. Accordingly, the RF-connector system, in particular the connection between the printed circuit board and the connector, can be manufactured less accurate, e.g., with greater tolerances, which saves costs.

The design of the ring to be tiltable relative to the support may effect that the support can also clamp adapters that are due to manufacturing tolerances of the connection between the printed circuit board and the RF-connector arranged in a position slightly oblique to an (ideal) axis of a standard state. The axis of the standard state may be perpendicular to a surface defined by the thickness of the printed circuit board (such as a (front) surface that connects a first flat side of the printed circuit board with the second flat side of the printed circuit board).

According to a further implementation form of said first aspect, the support comprises a recess for receiving the printed circuit board. Accordingly, if the printed circuit board extends beyond a plane to which the support can be attached, the part of the printed circuit board extending beyond this plane can be arranged inside of the recess. Thereby, an unwanted interference between the printed circuit board and the support is avoided.

According to a further implementation form of said first aspect, the support comprises a first portion and a second portion which are movable between an open position that permits the ring to be received between the portions and a closed position that clamps the ring between the portions. In other words, the first and second portions delimit a space in which the ring can be received, wherein in the open position the portions are distanced from one another by a first distance in order to allow the ring to be placed in the space, and wherein in the closed position the portions are distanced from one another by a second distance that is smaller than the first distance in order to reduce the space and thereby clamp the ring between the portions.

The first portion may be integrally formed with the second portion. Alternatively, the first portion and the second portion may be formed separately from one another. When the portions are formed integrally with one another, only one fastener (such as a screw) may be provided to move the portions towards one another. When the portions are separately formed from one another, two fasteners (such as two screws) may be provided to move the portions towards one another. The fasteners may be provided laterally with respect to the adapter and/or such that the adapter extends between the fasteners.

The axially extending slit of the support may be delimited by the first and second portions.

According to a second aspect of the present disclosure, an RF-connector system is provided. The RF-connector system comprises: a printed circuit board, an RF-connector attached to the printed circuit board, a clamping sleeve designed to clamp an adapter attached to the RF connector, and a joint bearing attachable to a housing of a measuring device. The joint bearing comprises a support. The Support is designed to receive the clamping sleeve inside of the support. And the joint bearing is designed to clamp the clamping sleeve inside of the support.

By clamping the clamping sleeve by the joint bearing, a mechanical stress at the connection interface between the printed circuit board and the RF connector can be eliminated or at least significantly reduced. This may be, because a force or torque acting on the adapter (for example due to a cable connected or attached to the adapter) may not transferred to the connection interface between the printed circuit board and the RF-connector, but may instead be absorbed by the joint bearing and then transferred away from the connection interface, such as to the housing of the measuring device.

By the clamping sleeve being received inside of the support of the joint bearing, the joint bearing and the clamping sleeve may form a joint. Thereby, it is made possible that also adapters, which are due to manufacturing tolerances of the connection between the printed circuit board and the RF-connector arranged in a position slightly oblique to an axis of a standard state, can be clamped by the joint bearing without undesirably bending the adapter into the orientation according to the standard state. Accordingly, the RF-connector system, for example, the connection between the printed circuit board and the connector, can be manufactured less accurate, e.g. with greater tolerances, which saves costs.

Further, by providing the clamping sleeve designed to clamp an adapter attached to the RF-connector, it is made possible that a variety of different adapters can be supported by the joint bearing. The clamping sleeve may clamp in a mating direction defined by the connector (a plug-in direction, etc.) and/or in a rotation direction.

According to a first implementation form of said second aspect, the RF-connector system further comprises an adapter attached to the RF-connector.

According to a further implementation form of said second aspect, the RF connector system further comprises a fastener (such as a screw) for fastening the joint bearing to the housing and/or a cover of a measuring device. The fastener may comprise two or three fastening elements.

According to a further implementation form of said second aspect, the RF connector system further comprises a screw arranged such that clamping of the clamping sleeve by the joint bearing can be effected by the screw cooperating with the joint bearing. Accordingly, by turning the screw, the joint bearing can selectively clamp the clamping sleeve or permit the clamping sleeve and thus the adapter clamped by the clamping sleeve to be removed from the support. For example, the screw is arranged such that screwing the screw into the joint bearing effects that a space, in which the clamping sleeve is arranged, is reduced, thereby clamping the clamping sleeve by the joint bearing.

According to a further implementation form of the second aspect, the RF connector system further comprises an actuator that can be actuated in order to effect a state in which the clamping sleeve clamps the adapter (and thereby prevents the adapter from moving out of the clamping sleeve). The actuator may comprise four actuators which may be arranged around the adapter when the adapter is received in, and/or clamped by, the clamping sleeve. The actuators may be arranged on a common circle.

According to a further implementation form of said second aspect, the actuator comprises a screw arranged such that clamping the adapter by the clamping sleeve can be effected by the screw cooperating with the clamping sleeve. For example, the screwing motion of the screw can effect that a tightener is moved into a position in which the tightener acts on a part of the clamping sleeve in order to reduce a space in which the adapter is received. The adapter will then be clamped by a wall, or between wall sections, delimiting the space.

According to a further implementation form of said second aspect, the RF-connector system further comprises a ring that is (axially) movable into a position in which a space of the clamping sleeve is contracted by the ring in order to clamp the adapter inside of the space.

According to a further implementation form of said second aspect, the clamping sleeve comprises a sleeve for receiving the adapter and a flange that extends radially outward from the sleeve and is designed to be clamped by the joint bearing. The sleeve may delimit the space that can be contracted by the ring. The actuator may pass through the flange and/or may extend parallel to an axis defined by the sleeve.

BRIEF DESCRIPTION OF THE DRAWINGS

Exemplary embodiments of this disclosure are now further explained with respect to the drawings by way of example only, and not for limitation. In the drawings.

DETAILED DESCRIPTION OF EMBODIMENTS

FIGS. 1-7 show an RF-connector system 1 according to a first embodiment. The system 1 comprises a printed circuit board 2 and an RF-connector 3 attached to the printed circuit board 2. The connector 3 may be attached to the printed circuit board 2 by soldering; thus the connector 3 may be connected to the printed circuit board 2 by a solder joint. It is important that the connection interface between the printed circuit board 2 and the connector 3 is not mechanically stressed. This may be particularly true when the connection interface represents a solder joint. In economically manufacturing the connection between the printed circuit board 2 and the connector 3, it is not always possible to attach the connector 3 in its intended position and orientation relative to the printed circuit board 2. This means that the connector 3 attached to the printed circuit board 2 may be not parallel to an ideal axis (angular deviation, such as not greater than 3°, for example in a range from 0.5° to 3°) and/or may be displaced (such as by not more than 1 mm) from an ideal position (such as displaced along x-, y-, and/or z-directions).

Figure 3:
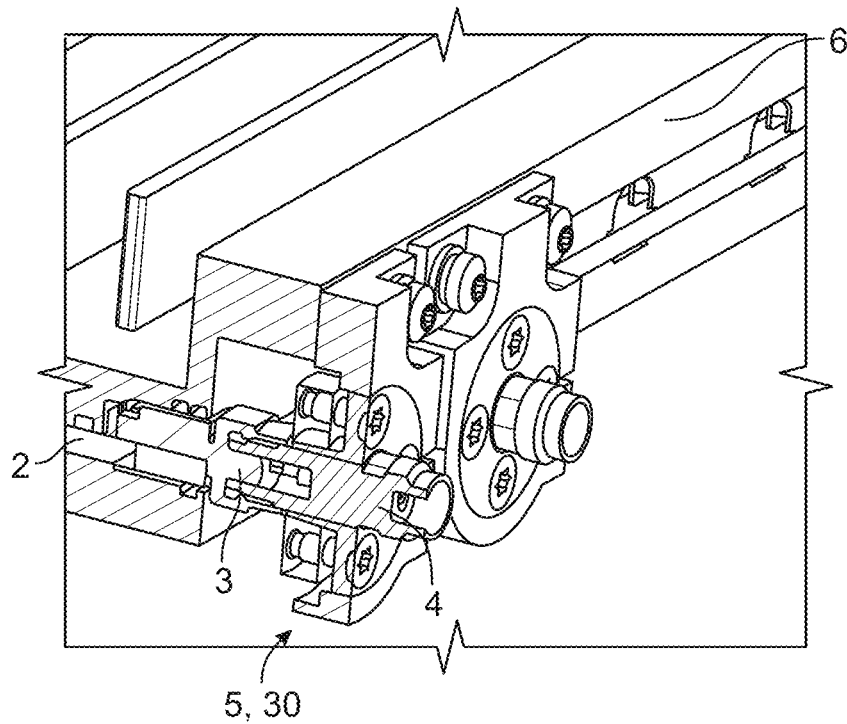
FIG. 3 shows a schematic perspective cross-sectional view (assembled state) of the embodiment shown in FIG. 2.

The connector 3 may be adapted for the transmission of radio frequency electromagnetic radiation (waves). FIG. 3 shows the connector 3 in more detail. The connector 3 may be a coaxial plug-in connector.

The system 1 further comprises an adapter 4 that is attached to the connector 3. The adapter 4 may be attached to the connector 3 by screwing. The adapter 4 is designed to be connectable to an RF-cable (not shown) such as in the form of a coaxial cable. Accordingly, the RF cable can be connected via the adapter 4 to the connector 3 and thus to the printed circuit board 2 for the transmission of radio frequency electromagnetic waves between the printed circuit board 2 and the cable. The adapter 4 provides for example the advantage that the connector 3 is prevented from wearing due to frequent attachment and detachment of the cable and rotation of the contacting surfaces relative to one another. The adapter 4 is detachable from the connector 3, e.g., the adapter 4 is a replaceable intermediate piece. Thus, when the adapter 4 is worn out or does not provide a reliable connection between the connector 3 and an RF-cable any more, the adapter 4 can be replaced by a new adapter 4.

The system 1 further comprises a support 5 that can be attached to a housing 6 of a measuring device. The housing 6 may comprise a base and/or a hood (a cover, etc.), wherein the support 5 is attachable to the base and/or the hood. The hood may be designed to shield high frequency radiation. The support 5 may be attached to the housing by a fastening element (fastener) 7 such as a screw. The fastening element 7 may comprise a screw-and-washer assembly.

The support 5 may comprise a through hole 8 through which the fastening element 7 extends in order to attach the support 5 to the housing 6. The fastening element 7 may extend through the through hole 8 with play. In other words, there may be a clearance (or gap) between the fastening element 7 extending through the through hole 8 and a wall delimiting the through hole 8. Thereby, the wall and thus the support 5 can move relative to the fastening element 7, for example along two axes that are perpendicular to one another (x- and y-direction) and that span a plane to which the fastening element 7 extends (with its longitudinal axis, e.g., a z-axis) perpendicularly. Such a play between the fastening element 7 and the through hole 8 can effect a compensation of manufacturing tolerances. The through hole 8 may have a rectangular shape (see FIG. 11). Thereby, the available displacement path of the support 5 relative to the fastening element 7 can be increased.

The support 5 may be attached to the housing 6 by a plurality of (such as three) fastening elements 7 which extends through a plurality of (such as three) through holes 8 respectively.

The support 5 is not limited to a specific material. For example, the support 5 may be made, or may consist, of a plastic material (such as a polymer). This has the advantage that the support 5 can be efficiently produced and/or 3D-printed. Additionally or alternatively, the support 5 may be made, or may consist, of metal. The geometry of the support 5 allows for a particularly efficient production, even when the material used is metal.

The support 5 is designed to clamp the adapter 4 directly or indirectly. Thereby, the support 5 can absorb a force and/or torque from the adapter 4 (such as a force and/or torque acting on the adapter 4 due to a force acting on the cable connected to the adapter 4) and divert it, or them, to the housing 6. Accordingly, it is avoided that the force and/or torque is/are transferred to the connection between the printed circuit board 2 and the connector 3. At this connection, a mechanical stress is thus eliminated or at least significantly reduced. At least part of the adapter 4 can be placed inside of the support 5, such as inside of a space (e.g., cylindrical) defined by the support 5 or by a through hole extending through the support 5. When the support 5 clamps, said space is contracted compared to a state in which the support 5 does not clamp and thereby permits the adapter 4 to be placed inside of the space or removed therefrom.

To provide the suitability of the support 5 for clamping, the support 5 may comprise an axially extending slit 51. The slit 51 may extend to form two portions 52, 53 in the support 5 which are movable relative to one another in order to move between an open position and a closed position; in other words, the distal ends of the portions 52, 53 may delimit the slit 51. In the open position, the adapter 4 can be placed inside of the support 5 to be received therein. In the closed position, the two portions 52, 53 are moved closer to one another to thereby effect a clamping force acting on the adapter 4; the adapter 4 is then clamped between the portions 52, 53. The portions 52, 53 may be integrally formed with one another, for example forming a C-shape.

Figure 6:
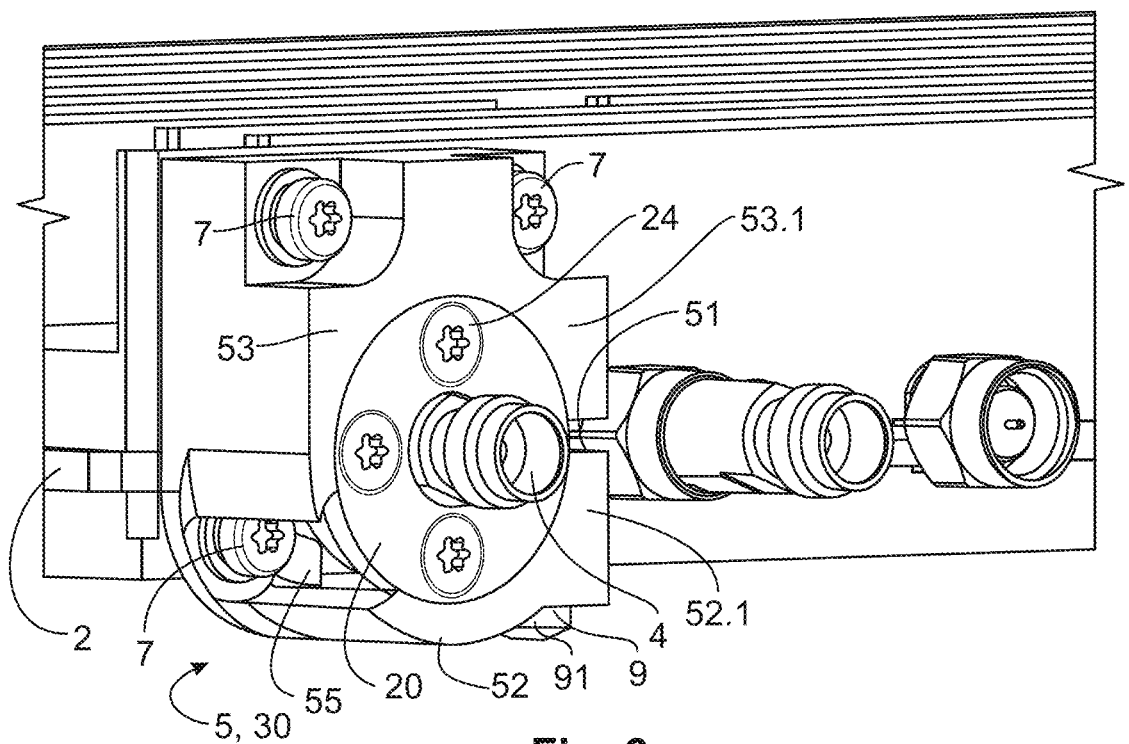
FIG. 6 shows a schematic perspective view of an embodiment of the RF-connector system.

As shown in FIG. 6, a screw 9 may be provided that is arranged such that clamping by the support 5 can be effected by the screw 9 cooperating with the support 5. The screw 9 may be screwed into the support 5 coming from below. The first portion 52 may comprise a first end portion 52.1 and the second portion 53 may comprise a second end portion 53.1. The end portions 52.1, 53.1 may be arranged on a lateral side and/or may delimit the slit 51. The screw 9 may comprise a head 91 that rests on the first end portion 52.1 and a shaft (extending from the head 91) into the second end portion 53.1. Screwing of the screw 9 into the second end portion 53.1 thus effects that the head 91 moves towards the second portion 53 and thereby moves the first portion 52 towards the second portion 53. By this relative movement, the portions 52, 53 are moved into the closed position that clamps the adapter 4.

Figure 7:
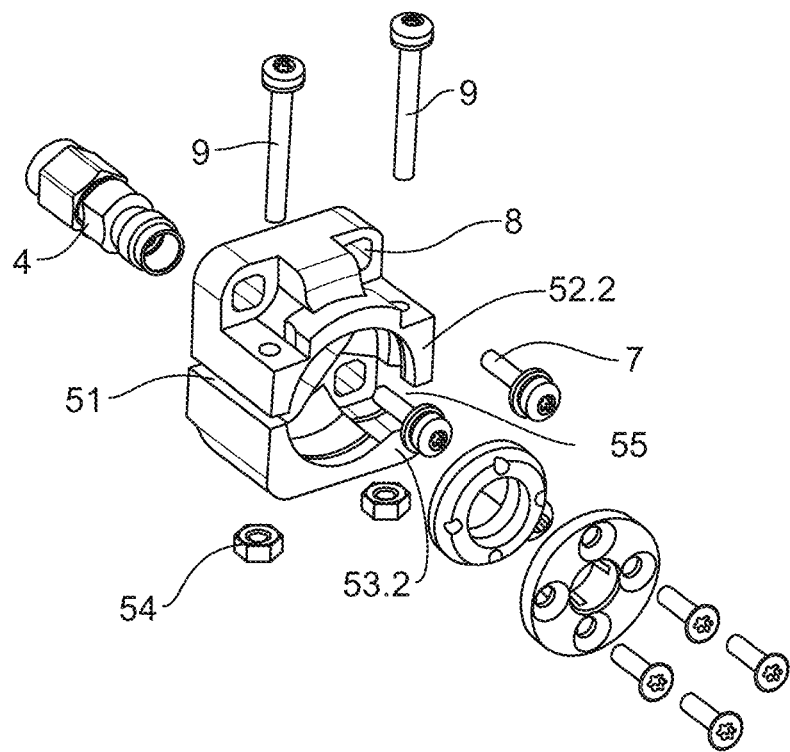
FIG. 7 shows a schematic perspective exploded view of a part of an embodiment of the RF-connector system.
Figure 7:
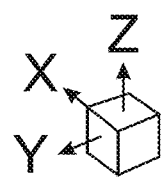

The second portion 53, in particular the second end portion 53.1, may house a nut 54 into which the screw 9 may be screwed (see FIG. 11); alternatively or additionally, the nut 54 may rest on the second end portion 53.1 (see FIG. 7). The nut 54 may be housed in a recess of the second portion 53 in such a way that a rotation of the nut 54 relative to the second end portion 53 is suppressed. Thereby, screwing the screw 9 into the nut 54 effects that the head 91 and thus the first portion 52 are moved towards the second portion 53 to thereby move the portions 52, 53 into the closed position that clamps the adapter 4.

As shown in FIG. 6, clamping of the adapter 4 by the support 5 may be effected by the support 5 cooperating with the screw 9 only. However, there may be also two or more screws cooperating with the support 5 in order to clamp the adapter 4. One possibility is exemplarily shown in FIG. 7. There, two screws 9 are provided on two lateral sides of the support 5 in order to move the first and second portions 52, 53 between the open position and the closed position. On the lateral side where the further screw 9 is provided (in FIG. 7 the right side), a further axial slit 55 can be provided. The further axial slit 55 is also visible in FIG. 6. The first and second portions 52, 53 comprise further end portions 52.2, 53.2 respectively which delimit the further axial slit 55. The further screw 9 rests with its head 91 on the further end portion 52.2 and extends with its shaft into the second end portion 53.2. Screwing of the screw 9 into the end portion 53.2 thus effects that the head 91 moves towards the second portion 53 and thereby moves the first portion 52 towards the second portion 53. The head of one of the screws 7 may be arranged in the further slit 55. This can make the arrangement of the support 5 with the screws 7 very compact. The axial slit 51 and the further axial slit 55 may be provided such that the portions 52, 53 are separated from one another.

According to the embodiment shown in FIGS. 1-7, the support 5 clamps the adapter indirectly, namely via a clamping sleeve 20. The clamping sleeve 20 is particularly well shown in FIGS. 4 and 5. On the one hand, the clamping sleeve 20 is designed to clamp the adapter 4. Thereby, the adapter 4 is attached to the clamping sleeve 20. On the other hand, the clamping sleeve 20 can be received inside of the support 5, for example at least partially between the portions 52 and 53, and clamped by the support 5, for example by the portions 52, 53 moving into the closed position, thereby clamping at least part of the clamping sleeve 20 between the portions 52, 53. Accordingly, the adapter 4 is attached to, and supported by, the support 5 via the clamping sleeve 20. A force or torque can be transferred from the adapter 4 via the clamping sleeve 20 to the support 5 and thus away from the connection interface between the printed circuit board 2 and the connector 3.

The clamping sleeve 20 may comprise a sleeve 21 that receives the adapter 4 and a flange 22 that extends radially outward from the sleeve 21 and that is designed to be clamped by the support 5. The flange 22 may be formed integrally with the sleeve 21. The sleeve 21 may comprise a wall 21.1 that delimits a space 21.2 of the sleeve 21, wherein the space 21.2 is adapted to receive the adapter 4. The wall 21.1 can be elastically bent inwardly so as to contract the space 21.2. The elasticity of the wall 21.1 can bias the wall 21.1 from the inwardly bent posture in an outward direction whereby the space 21.2 expands to return to its original state or volume.

The sleeve 21 may comprise one or more slits 21.3 that extend axially. The one or more slits 21.3 are arranged to impart an elasticity to the wall 21.1. A lateral end of the wall 21, e.g. an end of the wall 21 oriented in a peripheral direction of the sleeve 21, may delimit a slit 21.3. A plurality of slits 21.3 may be arranged so as to segment the wall 21 into a plurality of wall segments, which optionally have the same extension along a peripheral direction of the sleeve 21 and/or are arranged evenly distributed around an axis defined by the sleeve 21.

A ring 23 may be provided that extends around the sleeve 21 and can be moved into a closed position in which the ring 23 bends the wall 21.1 in an (radially) inward direction to thereby contract the space 21.2. The adapter 4 arranged in the contracted space 21.2 is clamped by the inwardly bent wall 21.1 and thus restricted from moving out of the sleeve 21. The ring 23 may be arranged to move (e.g. from the closed position) into an open position in which the ring 23 allows the wall 21.1 to return outwardly, e.g., in an (radially) outward direction, into its original (unbent) position to thereby expand the space 21.2. Accordingly, the space 21.2 returns from its contracted state into its original state. In the latter state, the wall 21.1 does not clamp the adapter 4, whereby the adapter 4 can be removed from, or placed inside of, the sleeve 21.

To effect that the ring 23, in the closed position, bends the wall 21.1 in the inward direction and, in the open position, allows the wall 21.1 to be in, or to elastically return outwardly into, its original (unbent) position, the wall 21.1 may comprise an outer surface that tapers along an axial direction. When the ring 23 is positioned at, and extends around, the wider end of the outer surface, the wall 21.1 is pressed inside of the ring 23, thereby bending the wall 21.1 in the inward direction to clamp the adapter 4. When the ring 23 is positioned at, and extends around, the smaller end of the outer surface, the ring 23 allows the wall 21.1 to be in its unbent state or at least in a state in which the wall 21.1 is bent inwardly in such a way that the adapter 4 can be removed from the sleeve 21. In the latter state, the wall 21.1 may be bent less inwardly than in the state when the ring 23 is positioned at, and extends around, the wider end of the outer surface of the wall 21.1.

Figure 4:
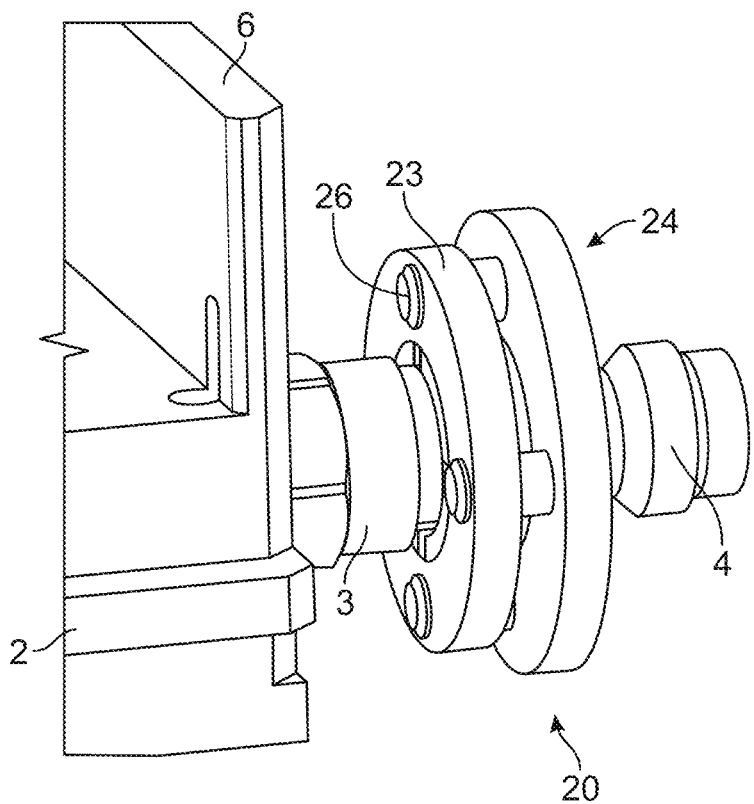
FIG. 4 shows a schematic perspective detailed view of a part of the embodiment shown in FIGS. 2 and 3.
Figure 5:
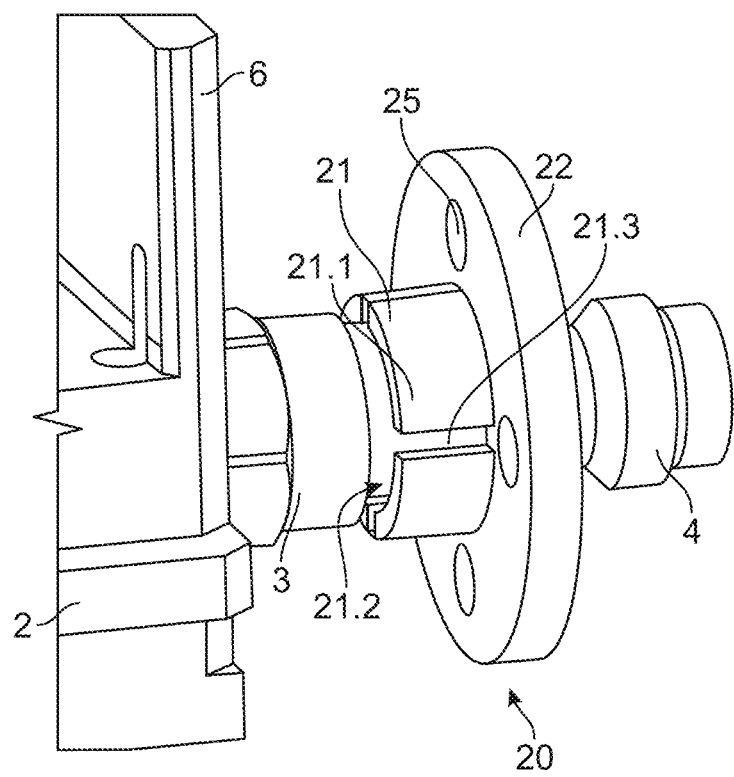
FIG. 5 shows a schematic perspective detailed view showing a clamping sleeve according to a possible design.

As shown in FIG. 4, the ring 23 may be moved into the closed position by using a screw 24. The screw 24 may thus represent an actuator that can be actuated by a user to effect a state of the clamping sleeve 20, in which state the clamping sleeve 20 clamps the adapter. The screw 24 may extend through the flange 22 (e.g. via a through hole 25) and cooperate with the ring 23 in such a way that turning (screwing) the screw 24 moves the ring 23 towards the flange 22 and into the closed position in which the adapter 4 is clamped by the sleeve 21. For example, a screw sleeve 26 may extend (e.g. via a through hole) through the ring 23 and rest with its head on a side of the ring 23 facing away from the flange 22. The screw 24 is screwed into the screw sleeve 26 whereby the screw sleeve 26 and thus its head are moved towards the flange 22. By this motion, the head of the screw sleeve 26 drives the ring 23 axially towards the flange 22 and into the position in which the ring 23 bents the wall 21.1 inwardly in order to clamp the adapter 4 (closed position). Several (such as two, three or four) of the screws 24 may be provided that may be screwed into several (such as two, three or four) of the screw sleeves 26 respectively. The screws 24 may be arranged around the adapter and/or on a common circle.

Figure 1:
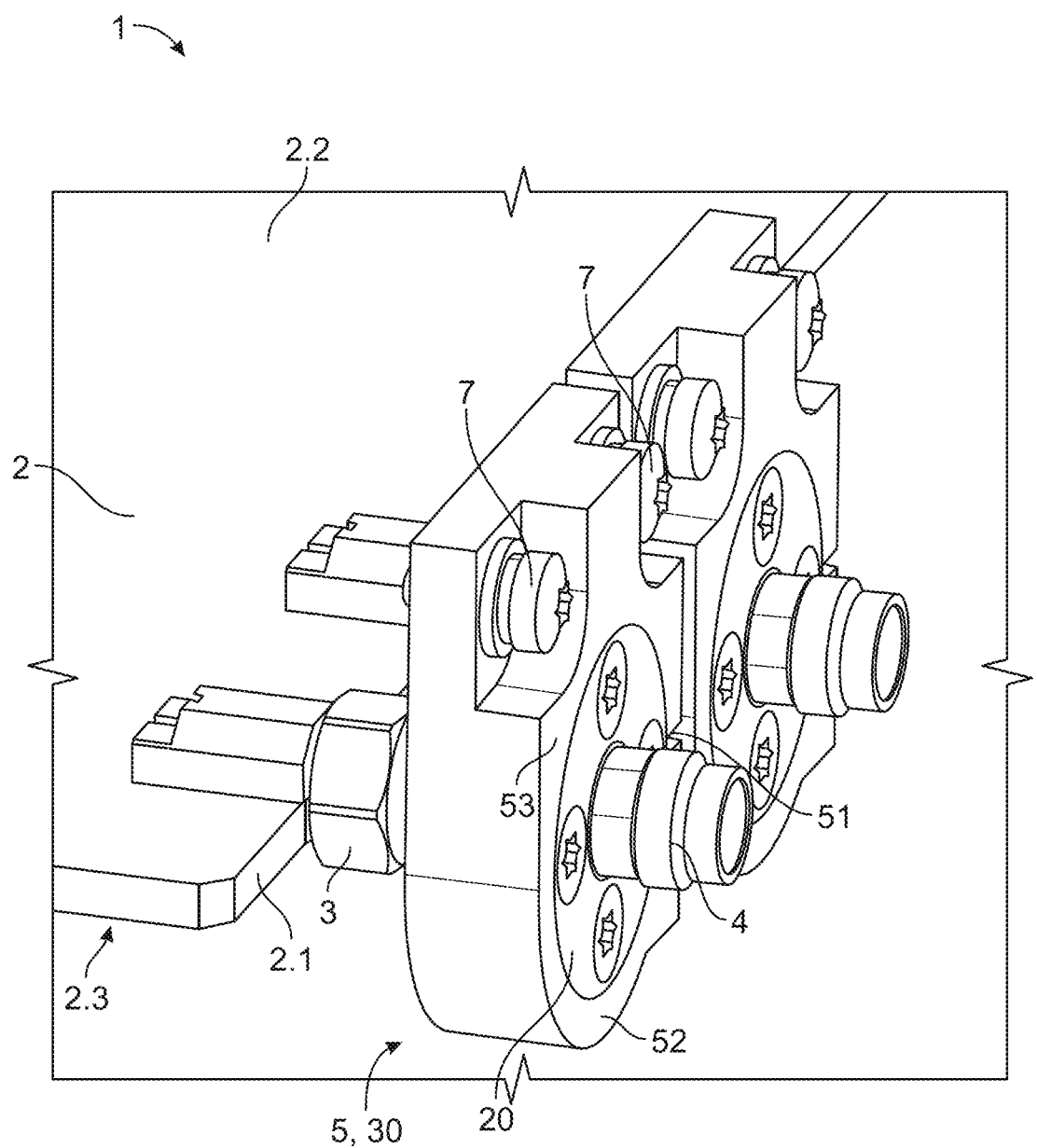
FIG. 1 shows a schematic perspective view of an embodiment of the RF-connector system.
Figure 2:
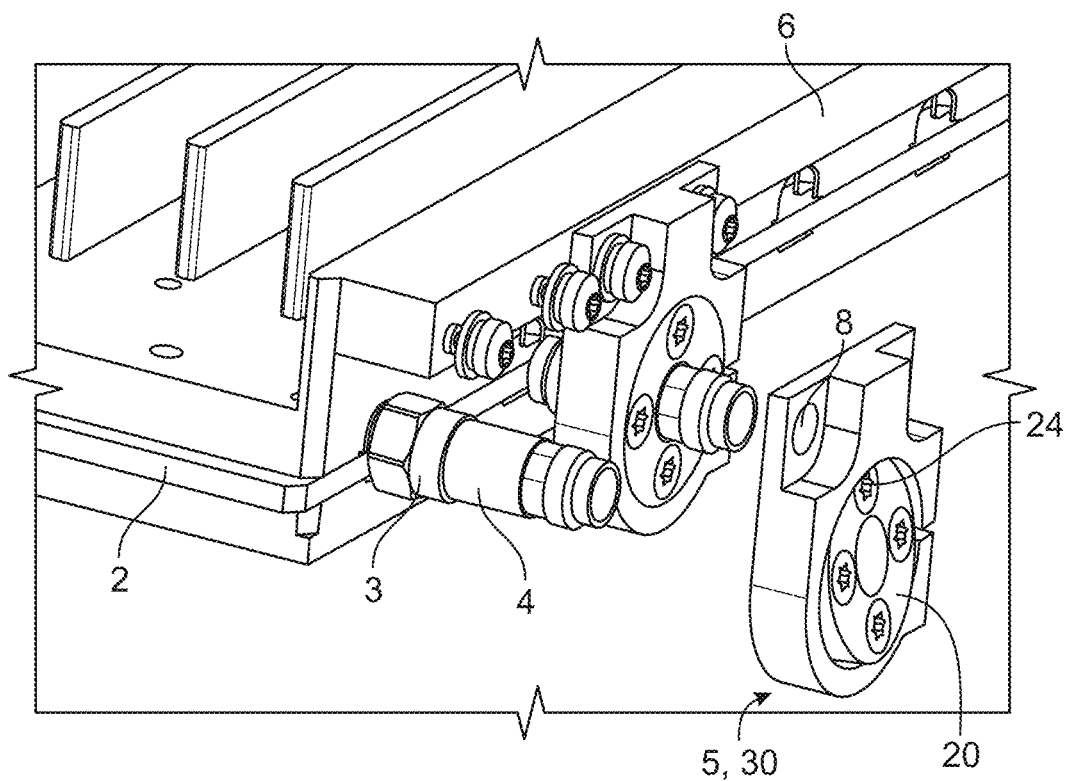
FIG. 2 shows a schematic perspective and partial exploded view of the embodiment shown in FIG. 1 in combination with a part of a measuring device.

The support 5 may be comprised by a joint bearing 30. Thereby, the joint bearing 30 and the clamping sleeve 20, received inside of the support 5, can form a joint. When received inside of the support 5, the clamping sleeve 20 can be tilted relative to the joint bearing 30 and support 5. When the clamping sleeve 20 is received in, but not yet clamped by, the support 5, the support 5 not only allows a rotation of the clamping sleeve 20 about its longitudinal axis (e.g., a roll axis; the axis along which the adapter 4 extends, when clamped by the clamping sleeve 20) but also allows a tilting about an axis perpendicular to the longitudinal axis, e.g., about a yaw axis and/or a pitch axis, as shown in FIG. 2.

Thereby, it is possible that the joint bearing 30 can clamp the adapter 4 in different orientations relative to the support 5 or joint bearing 30. The different orientations of the adapter 4 may be due to different orientations of the connector 3 to which the adapter 4 is attached. The different orientations of the connector 4 may comprise a first orientation, in which a mating axis defined by the connector 3 is parallel to a normal vector (which may represent an ideal axis) of an end face 2.1 of the printed circuit board 2 connecting the two flat sides 2.2, 2.3 of the printed circuit board, and a second orientation, in which the mating axis is not parallel (e.g. with an angle of not more than +−3°) to said normal vector, e.g. due to manufacturing tolerances, but inclined to said normal vector. In the second orientation, the mating axis may also deviate from its intended orientation with respect to a normal vector of the flat side 2.2 and/or flat side 2.3. Accordingly, the mating axis may be, in the second orientation, not perpendicular to the normal vector of the flat side 2.2 and/or flat side 2.3.

Further, it is possible that the joint bearing 30 can clamp the adapter 4 in different positions relative to the support 5 or joint bearing 30. The different positions of the adapter 4 may be due to different positions of the connector 3 to which the adapter 4 is attached. The different positions of the connector 4 may comprise a first position (which may represent an ideal position) and a second position, in which the adapter 4 is displaced (e.g. by at most 1 mm) from the first (ideal) position along a direction parallel to the normal vector of the end face 2.1 and/or parallel to the normal vector of the flat side 2.2 and/or flat side 2.3; said displacement may be due to manufacturing tolerances.

FIGS. 8-11 show an RF-connector system 1' according to a second embodiment. The RF-connector system 1' corresponds to the RF-connector system 1 described above with the difference that the clamping sleeve 20 is omitted. The adapter 4' corresponds to the adapter 4 described above with the difference that the adapter 4' comprises a ring 40 (such as a flange) that extends radially outwardly. Accordingly, the clamping sleeve 20 and the optional components cooperating with the clamping sleeve 20 (the actuator 23, the ring (disc) 23, etc.) are not necessary anymore. The ring 40 may be integrally formed with a housing of the adapter 4' that houses an electrical conduit that transmits the RF signals between the connector 3 and the cable connected to the adapter 4'.

Figure 9:
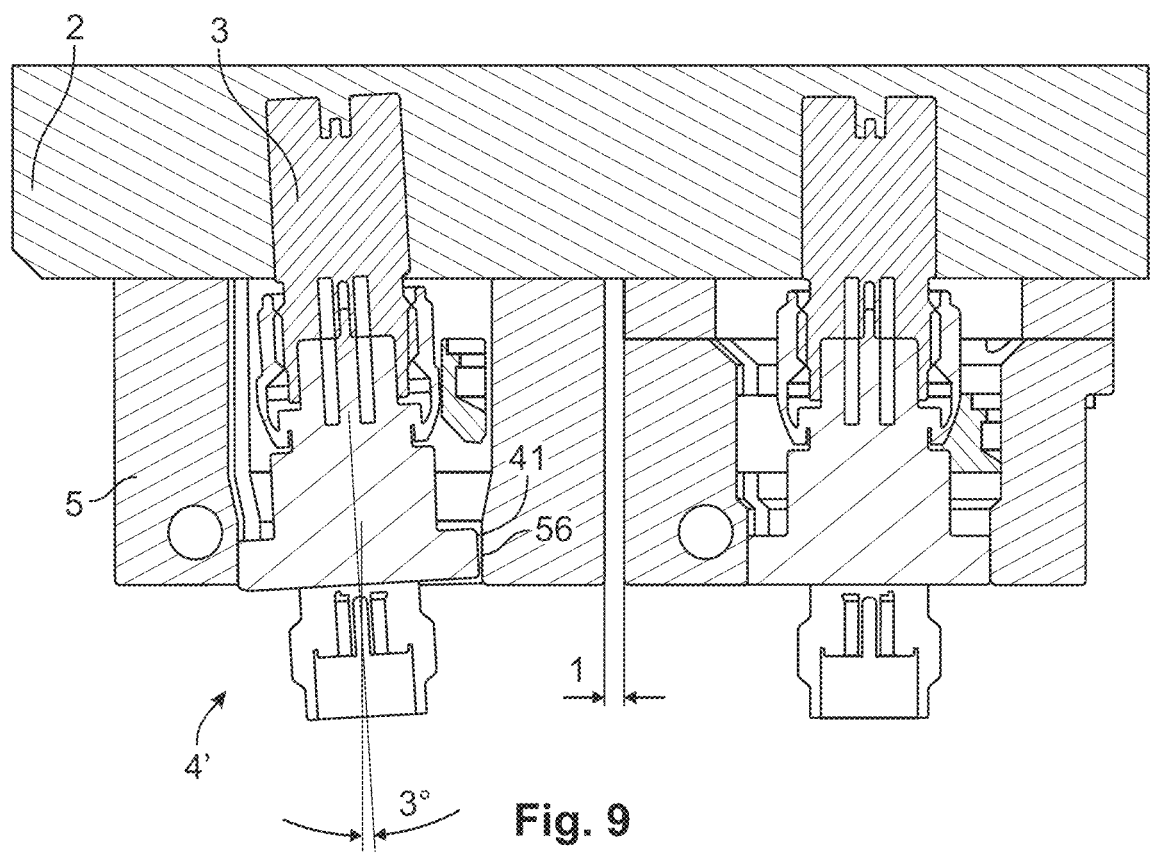
FIG. 9 shows a schematic cross-sectional view of the two left RF-connector system in the embodiment shown in FIG. 8.
Figure 10:
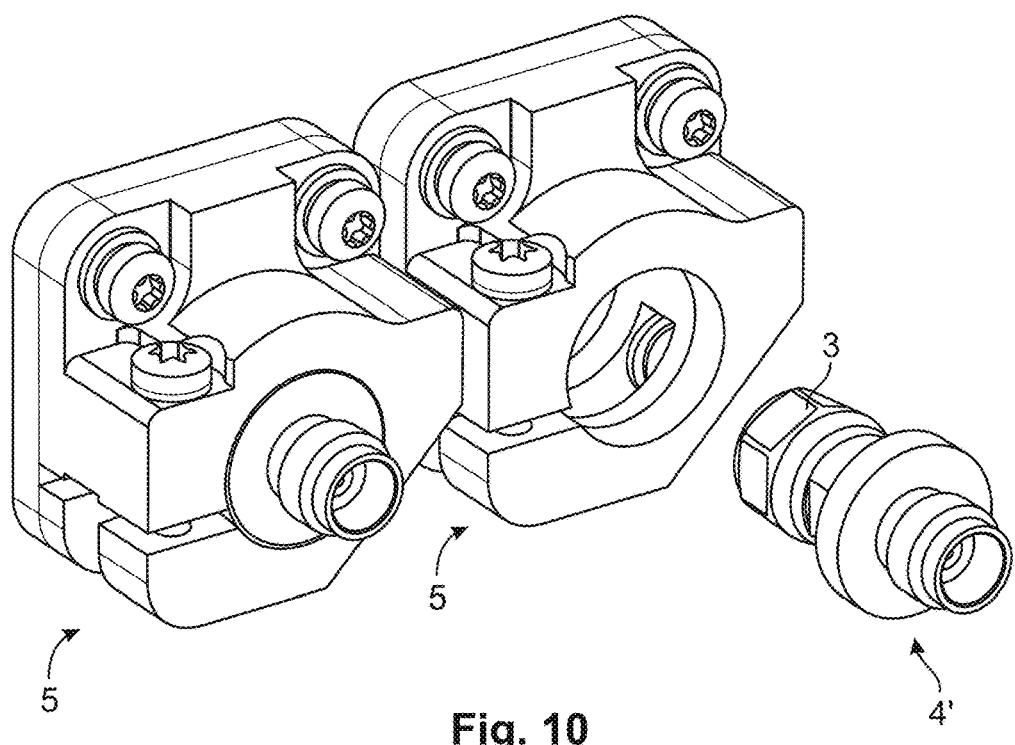
FIG. 10 shows a schematic perspective view of two RF-connector systems according to one of the RF-connector systems shown in FIG. 8 without the printed circuit board and RF-connector.

The ring (e.g. in the form of a flange) 40 is designed to be received inside of the support 5 and to be clamped by the support 5, analogous to the clamping of the clamping sleeve 20 or flange 22 by the support 5 described above. The ring 40 may comprise an outer (contact) surface 41 that defines the outer circumference of the ring 40 and that is (in a lateral cross-sectional view) curved. By this curved outer surface 41, the ring 40 is allowed to be tilted relative to the support 5. This is illustrated in FIG. 9.

Figure 8:
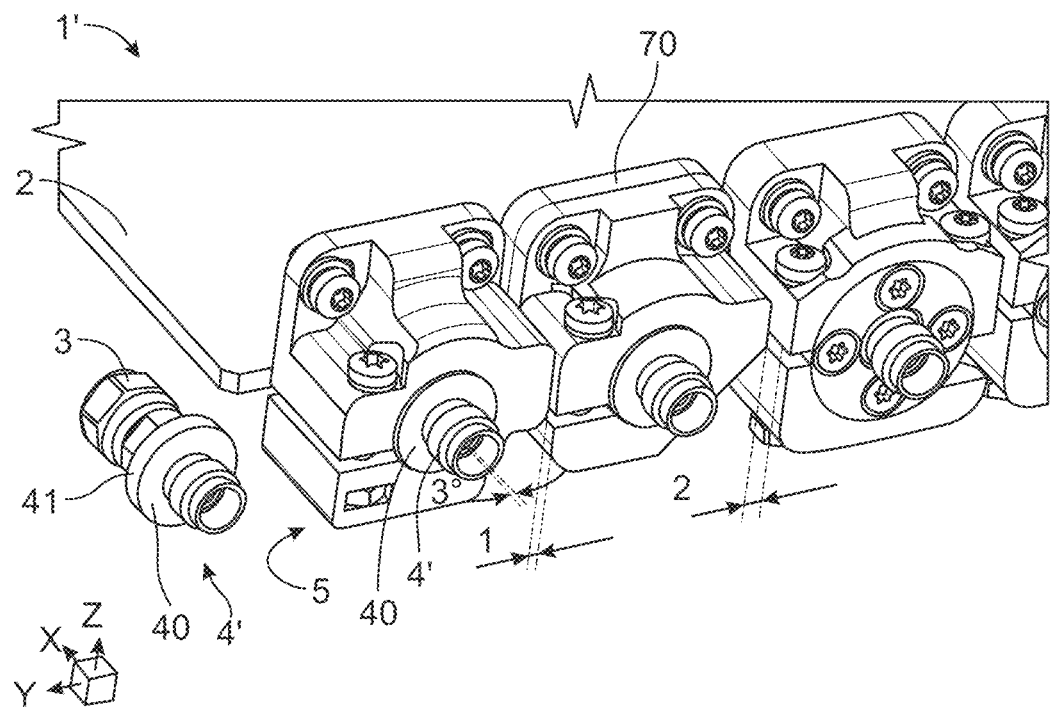
FIG. 8 shows a schematic perspective view of an embodiment of the RF-connector system.

When the ring 40 is received in, but not yet clamped by, the support 5, the support 5 allows a rotation of the ring 40 about its longitudinal axis (e.g., a roll axis; the axis along which the adapter 4' extends). On the other hand, the curved outer surface 41 allows a tilting of the adapter 4' about an axis perpendicular to the longitudinal axis, e.g., about a yaw axis (as shown in FIGS. 8 and 9) and/or a pitch axis. Thereby, it is possible that the support 5 (or joint bearing 30) can clamp the adapter 4' in different orientations relative to the support 5. In different orientations of the adapter 4' relative to the support 5 the clamping force exerted by the support 5 acts on different positions on the circumference of the curved surface 41 respectively. The different orientations of the adapter 4' may be due to different orientations of the connector 3 to which the adapter 4' is attached, as described above. By the curved outer surface 41, a linear compression can act on the outer surface 41 when the ring 40 is clamped inside of the support 5 which may receive the ring 40 in a cylindrical state. Thereby, a particularly high flexibility with respect to the position of the adapter 4' is achieved.

The outer surface 41 may be curved along its entire circumference. Alternatively, only segments of the outer surface 41 may be curved. The segments may be arranged along the circumference of the ring 40. The curvature may have a radius that has its center on the central axis and/or the center of the ring 40. The outer surface 41 of the ring may correspond to the radially outer surface of a slice of a sphere. The outer surface 41 may be curved with a radius in the range from 10 mm to 14 mm (R10–R14), such as 12 mm (R12). The outer surface 41 may be roughened, e.g. by providing the outer surface 41 with defined or undefined inequalities, ridges, and/or projections, in order to increase a coefficient of friction, for example, such that a surface roughness (Ra) is higher than a surface roughness (Ra) of other parts of the ring 40 or adapter 4'.

The support 5 may comprise a contact surface 56 that faces in a radial inward direction. The contact surface 56 may directly connect to, e.g. contact, the outer surface 41 of the ring 40 (or, alternatively, the clamping sleeve 20, such as the flange 22), as shown in FIG. 9. The contact surface 56 may be roughened, e.g. by providing the surface 56 with defined or undefined inequalities, ridges, and/or projections, in order to increase a coefficient of friction, for example, such that a surface roughness (Ra) is higher than the surface roughness (Ra) of other parts of the support 5, such as of a front side of the support 5 that faces outwardly, e.g. away from the printed circuit 2. A clamping force acting between the surface 56 and the ring 40 (e.g. the outer surface 41) thus effects a frictional force that is advantageously increased.

An exemplary method for assembling the RF-connector system 1' may be as follows: a) attaching the adapter 4' to the connector 3; b) positioning (such as pushing) the support 5 over the ring 40 of the adapter 4'; c) attaching, optionally by one or more (e.g., three) fasteners (screws, screw-and-washer assemblies, etc.), the support 5 to an attachment section, such as the housing 6; and d) tightening the fastener 9 to thereby clamp the ring 40 and thus the adapter 4' inside of the support 5.

As shown in FIG. 8, an insulating layer 70 may be arranged to electrically and thermally decouple the support 5 from the housing 6 of the measuring device. Thereby, a transmission of electrical current and heat between the support 5 and the housing 6 is avoided. The insulating layer 70 may be sandwiched between the support 5 and the housing 6. The insulating layer 70 may have different shapes, such as a shape that, when viewed perpendicular onto the layer 70, can be covered by the support 5. The shape of the insulating layer 70 may be such that its lateral edges and its top edge can be flush with the lateral edges and the top edge of the support 5.

Figure 11:
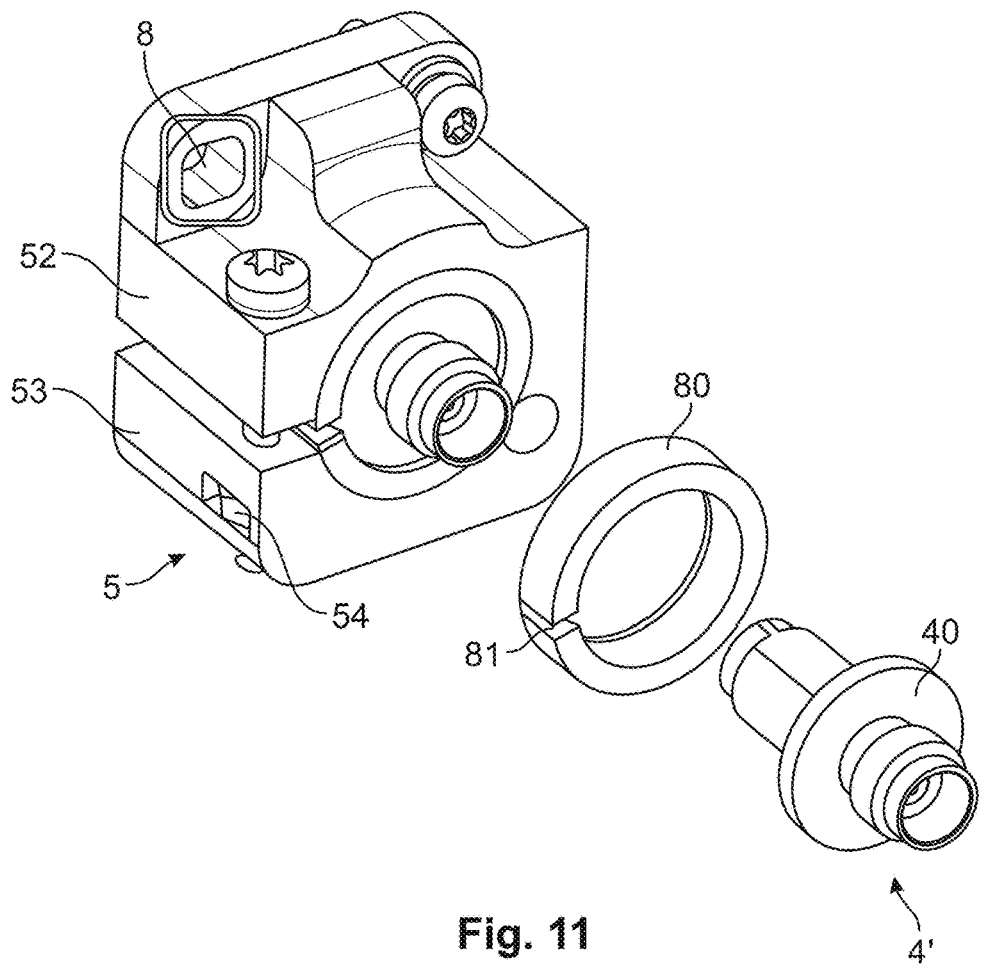
FIG. 11 shows a schematic perspective view of an RF-connector system according to one of the RF-connector systems shown in FIG. 8, including an additional ring to increase the friction between the support and the ring of the adapter.

As shown in FIG. 11, the system 1' may further comprise an additional ring ("friction ring") 80 arranged to increase the friction between the support 5 and the ring 40. The additional ring 80 may extend around the adapter 4' or ring 40. For example, the additional ring 80 may extend in a space delimited by the outer surface 41 and the contact surface 56. The additional ring 80 may be roughened on its radially inward surface and/or radially outward surface, in for example, such that the surface(s) has/have a greater surface roughness (Ra) than the surface roughness (Ra) of the outer surface 41 and/or contact surface 56. The ring 80 may be comprise an axially extending slit 81 to form an open ring. Thereby, the ring 80 can be easily adapt its shape to different shapes, such as different diameters of the ring 40 placed inside of the ring 80.

The additional ring 80 may be also used in combination with the clamping sleeve 20 in order to increase the friction between the support 5 and the clamping sleeve 20. For example, the additional ring 80 may extend in a space delimited by the flange 22 and the contact surface 56.

Figure 12:
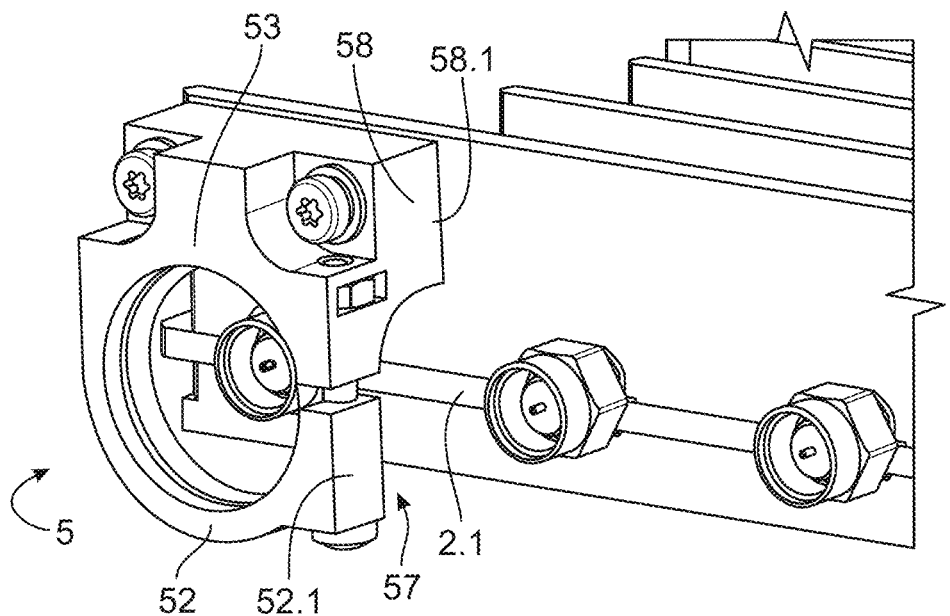
FIG. 12 shows a schematic perspective view of an exemplary design of a support (or joint bearing)
Figure 13:
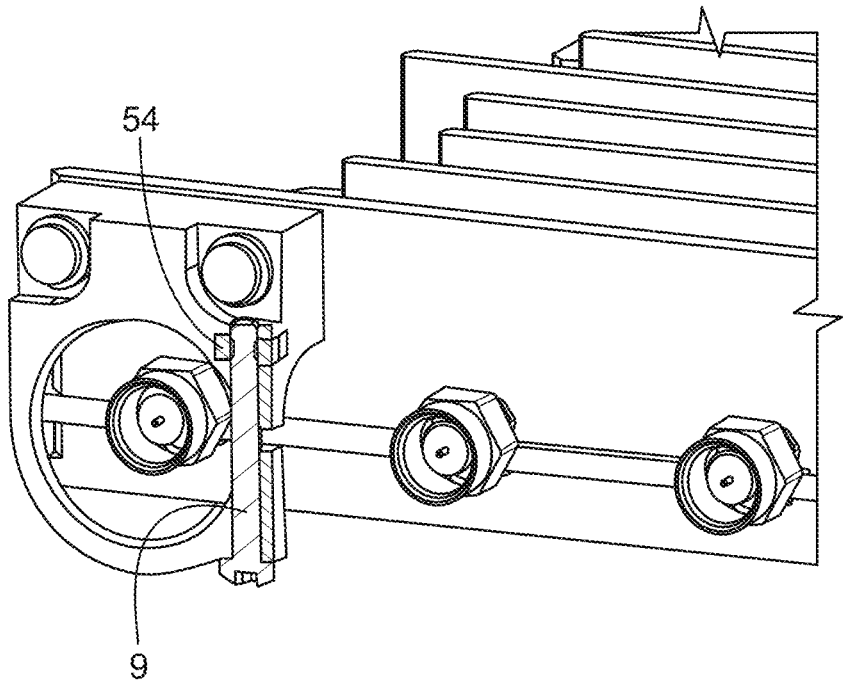
FIG. 13 shows a schematic perspective cross-sectional view of the support shown in FIG. 12.

As shown in FIGS. 12 and 13, the support 5 may comprise an optional recess 57 (which may be in the form of a slit) in which part of the printed circuit board 2, such as the part comprising the rim and/or end face 2.1 of the printed circuit board 2, can be received. The recess 57 may be delimited by a protruding section 58, which may be on the side of the second (clamping) portion 53. The through hole 8 (or two through holes 8) may extend through the section 58. The section 58 may comprise a surface 58.1 that can be attached to the housing 6. The surface 58.1 may lie in a plane. When the support 5 is attached to the housing 6 via the surface 58.1 (e.g., the surface 58.1 faces the housing 6), a part of the printed circuit board 2 extending beyond said plane can be arranged inside of the recess 57. Thereby, the printed circuit board 2 does not interfere with the support 5. The recess 58 may comprise a bottom that is comprised at least in part by the first (clamping) section 52, such as by the first end portion 52.1.

The above-described RF-connector systems can be used in applications with limited spatial conditions. For example, the screws used in the system, such as for attaching the support to the housing 6, for clamping in combination with the support, and/or for actuating the clamping sleeve 20, may have a thread in the range from M2 to M3, such as M2.5. Further, the fasteners (such as the screws) used are all arranged in such a way that they are well accessible.

While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

Although the present disclosure has been illustrated and described with respect to one or more implementations, equivalent alterations and modifications will occur to others skilled in the art upon the reading and understanding of this specification and the annexed drawings. In addition, while a particular feature of this disclosure may have been disclosed with respect to only one of several implementations, such feature may be combined with one or more other features of the other implementations as may be desired and advantageous for any given or particular application.

What is claimed is:

1. An RF-connector system, comprising:
a printed circuit board,
an RF-connector attached to the printed circuit board,
an adapter attached to the RF-connector, wherein the adapter comprises a radially outwardly extending ring, and
a support attachable to a housing of a measuring device;
wherein the support is designed to receive the ring inside of the support, and
wherein the support is designed to clamp the ring.

2. The RF-connector system according to claim 1, further comprising a screw arranged such that clamping of the ring by the support can be effected by the screw cooperating with the support.

3. The RF-connector system according to claim 1, wherein the support comprises a slit that extends axially.

4. The RF-connector system according to claim 1, further comprising an additional ring arranged to increase the friction between the support and the ring of the adapter.

5. The RF-connector system according to claim 1, wherein the ring comprises an outer surface that defines the outer circumference of the ring, wherein the outer surface is roughened to increase a coefficient of friction such that a frictional force is increased when the ring is clamped by the support.

6. The RF-connector system according to claim 1, wherein the support comprises a contact surface that faces in a radial inward direction, wherein the contact surface is roughened to increase a coefficient of friction such that a frictional force is increased when the ring is clamped by the support.

7. The RF-connector system according to claim 1, further comprising an insulating layer arranged to electrically and thermally decouple the support from the housing of the measuring device.

8. The RF-connector system according to claim 1, wherein the ring comprises an outer surface that defines the outer circumference of the ring, wherein the outer surface is curved so as to allow the ring to be tilted relative to the support.

9. The RF-connector system according to claim 1, wherein the support comprises a recess for receiving the printed circuit board.

10. The RF-connector system according to claim 1, wherein the support comprises a first portion and a second portion which are movable between an open position that permits the ring to be received between the portions and a closed position that clamps the ring between the portions.

11. The RF-connector system according to claim 10, wherein the first portion is integrally formed with the second portion.

12. The RF-connector system according to claim 10, wherein the first portion and the second portion are formed separately from one another.

13. An RF-connector system, comprising:
a printed circuit board,
an RF-connector attached to the printed circuit board,
a clamping sleeve designed to clamp an adapter attached to the RF-connector, and
a joint bearing attachable to a housing of a measuring device;
wherein the joint bearing comprises a support designed to receive the clamping sleeve inside of the support, and
wherein the joint bearing is designed to clamp the clamping sleeve inside of the support.

14. The RF-connector system according to claim 13, further comprising an adapter attached to the RF-connector.

15. The RF-connector system according to claim 13, further comprising a fastener for fastening the joint bearing to the housing and/or a cover of a measuring device.

16. The RF-connector system according to claim 13, further comprising a screw arranged such that clamping of the clamping sleeve by the joint bearing can be effected by the screw cooperating with the joint bearing.

17. The RF-connector system according to claim 13, further comprising an actuator that can be actuated in order to effect a state in which the clamping sleeve clamps the adapter.

18. The RF-connector system according to claim 17, wherein the actuator comprises a screw arranged such that clamping the adapter by the clamping sleeve can be effected by the screw cooperating with the clamping sleeve.

19. The RF-connector system according to claim 13, further comprising a ring that is moveable into a position in which a space of the clamping sleeve is contracted by the ring in order to clamp the adapter inside of the space.

20. The RF-connector system according to claim 13, wherein the clamping sleeve comprises a sleeve for receiving the adapter and a flange that extends radially outward from the sleeve and is designed to be clamped by the joint bearing.

* * * * *